United States Patent
Iino

(10) Patent No.: US 8,451,426 B2
(45) Date of Patent: May 28, 2013

(54) EXPOSURE METHOD AND EXPOSURE APPARATUS

(75) Inventor: Jin Iino, Tokyo (JP)

(73) Assignee: V Technology Co., Ltd. (JP)

( * ) Notice: Subject to any disclaimer, the term of this patent is extended or adjusted under 35 U.S.C. 154(b) by 918 days.

(21) Appl. No.: 12/301,984

(22) PCT Filed: Jun. 7, 2006

(86) PCT No.: PCT/JP2006/311434
§ 371 (c)(1),
(2), (4) Date: Nov. 21, 2008

(87) PCT Pub. No.: WO2007/141852
PCT Pub. Date: Dec. 13, 2007

(65) Prior Publication Data
US 2010/0128239 A1   May 27, 2010

(51) Int. Cl.
*G03B 27/32*   (2006.01)
*G01B 11/00*   (2006.01)
*G03F 9/00*    (2006.01)

(52) U.S. Cl.
CPC .............. *G03F 9/70* (2013.01); *G03F 9/7084* (2013.01)
USPC ............................. 355/64; 356/400; 355/77

(58) Field of Classification Search
CPC ..... G03F 9/7084; G03F 9/7088; G03F 9/7076; G03F 9/7003; G03F 9/70; G03F 7/7035
USPC ................. 355/53, 64, 67, 77; 356/399–401; 242/563
See application file for complete search history.

(56) References Cited

U.S. PATENT DOCUMENTS

| 4,798,470 A | * | 1/1989 | Moriyama et al. ............ 356/401 |
| 5,198,857 A | * | 3/1993 | Goto ................................. 355/53 |

(Continued)

FOREIGN PATENT DOCUMENTS

| JP | 60-257521 | 12/1985 |
| JP | 62-089328 | 4/1987 |

(Continued)

OTHER PUBLICATIONS

International Search Report from International Application No. PCT/JP2006/311434.

(Continued)

*Primary Examiner* — Toan Ton
*Assistant Examiner* — Steven H Whitesell Gordon
(74) *Attorney, Agent, or Firm* — Kolisch Hartwell, P.C.

(57) ABSTRACT

In an exposure apparatus, exposure light from a lamp (continuous light source) (9) is applied at an exposure station (exposure section) (2) to a substrate (4), which is being transferred at a fixed speed in a fixed direction by a substrate transfer section (5), through a mask (11) arranged on an optical axis (optical path) (S) of an exposure optical system (3). At the time of exposing an image of an opening section (11*a*) of the mask (11) on the substrate (4), the front edge and the side edge (pattern edge) of a pixel (reference pattern) (18) previously formed on the substrate (4) are photographed by a linear CCD (20) of an imaging section (6), and a reference position in the transfer direction and a direction vertical to such direction on the substrate (4) is detected. When the pixel (18) imaged by the imaging section (6) is shifted to an exposure position (E) form an imaging position (F), the exposure station (2) continuously exposes an exposure region along the transfer direction of the substrate (4) while adjusting the position of the mask (11) so that the position of the mask (11) matches with the reference position on the substrate (4).

5 Claims, 5 Drawing Sheets

U.S. PATENT DOCUMENTS

| | | | | |
|---|---|---|---|---|
| 5,500,736 | A * | 3/1996 | Koitabashi et al. | 356/620 |
| 5,936,712 | A * | 8/1999 | Ito et al. | 355/55 |
| 6,200,824 | B1 * | 3/2001 | Hashimoto | 438/15 |
| 6,463,184 | B1 * | 10/2002 | Gould et al. | 382/289 |
| 6,525,804 | B1 * | 2/2003 | Tanaka | 355/53 |
| 7,969,553 | B2 * | 6/2011 | Sato et al. | 355/64 |
| 8,037,597 | B2 * | 10/2011 | Tsunekawa | 29/849 |
| 2005/0040399 | A1 * | 2/2005 | Kuo et al. | 257/72 |
| 2005/0254032 | A1 * | 11/2005 | Ozaki et al. | 355/55 |
| 2006/0066715 | A1 * | 3/2006 | Fukui | 347/262 |
| 2006/0132735 | A1 * | 6/2006 | Lof et al. | 355/53 |
| 2006/0194127 | A1 * | 8/2006 | Lo et al. | 430/7 |
| 2007/0009813 | A1 * | 1/2007 | Fujita | 430/22 |
| 2007/0070319 | A1 * | 3/2007 | Nakamura et al. | 355/55 |

FOREIGN PATENT DOCUMENTS

| | | | |
|---|---|---|---|
| JP | 62-200726 A | 9/1987 | |
| JP | 03-089511 | 4/1991 | |
| JP | 6-43659 A | 2/1994 | |
| JP | 7-74079 A | 3/1995 | |
| JP | 09-127702 | 5/1997 | |
| JP | 2000-35676 A | 2/2000 | |
| JP | 2000-347020 | 12/2000 | |
| JP | 2001-264999 | 9/2001 | |
| JP | 2002-31896 A | 1/2002 | |
| JP | 2002-040669 | 2/2002 | |
| JP | 2002-110541 A | 4/2002 | |
| JP | 2004-341280 | 12/2004 | |
| KR | 10-2003-0073253 | 9/2003 | |
| WO | 99/35537 A1 | 7/1999 | |
| WO | 2006/051700 A1 | 5/2006 | |

OTHER PUBLICATIONS

Office action issued Nov. 19, 2010 in Korean Patent Application No. 10-2008-7030144, with English translation.

Notice of Reasons for Rejection from corresponding Japanese Patent Application No. 2005-111928, mailed on Dec. 12, 2008 with its English language translation.

Japanese Patent Office, "Notice of Reasons for Rejection" from corresponding Japanese Patent Application No. 2005-111928, mailed Dec. 5, 2008, with its English language translation.

Japanese Patent Office, "Notice of Allowance" from corresponding Japanese Patent Application No. 2005-111928, mailed Apr. 8, 2009, with its English language translation.

Photoelectricity Technology Invention Examination Department, Beijing Patent Examination Cooperation Center, Office Action in connection with corresponding Chinese Patent Application No. 200680054845.2, dated Aug. 10, 2012, 13 pages.

* cited by examiner

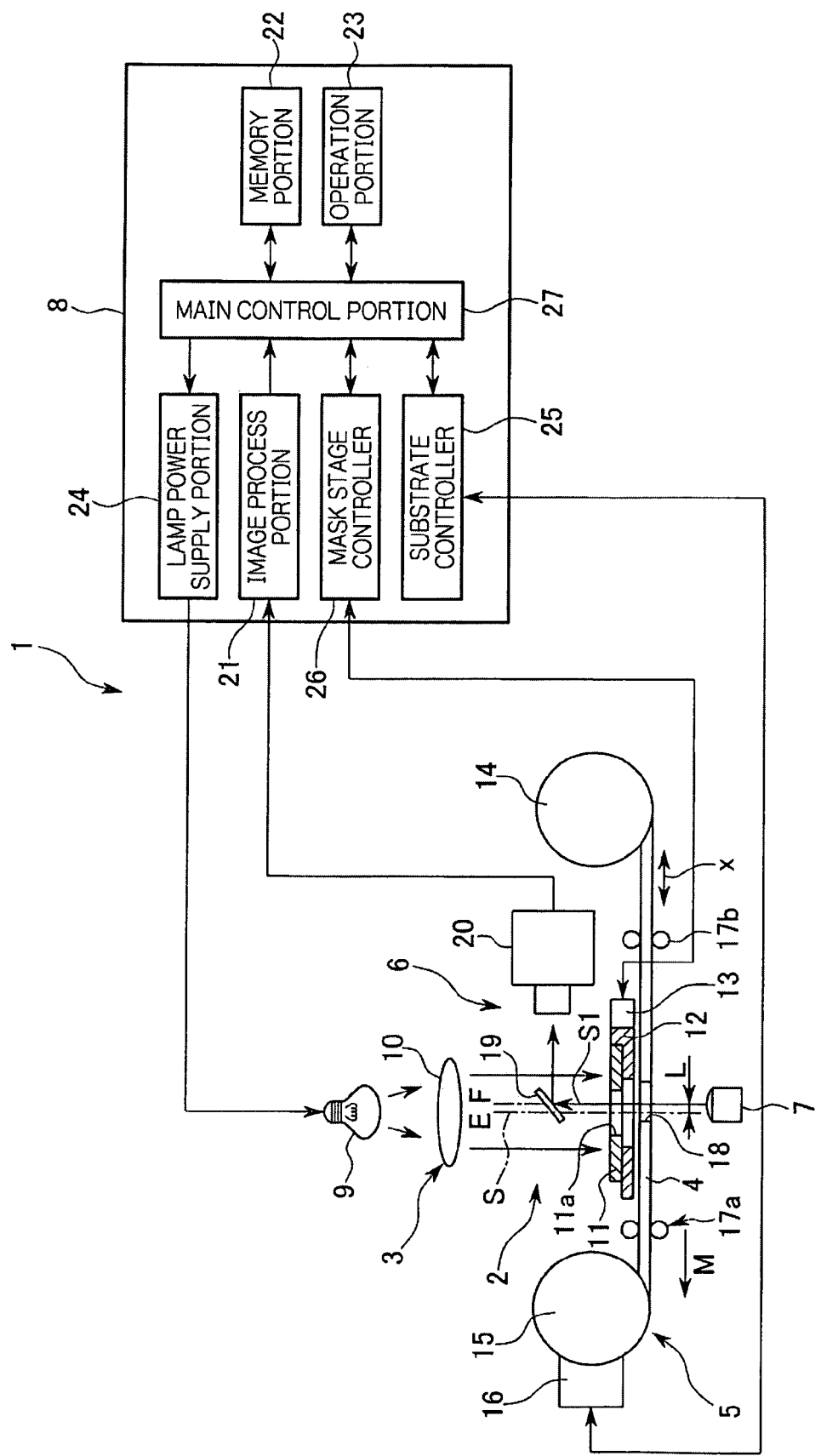

EXPOSURE METHOD AND EXPOSURE APPARATUS

TECHNICAL FIELD

The present invention relates to an exposure method and an exposure apparatus for manufacturing a color filter for a liquid crystal panel, and the like.

BACKGROUND ART

In manufacturing a color filter for a liquid crystal panel, an exposure method and an exposure apparatus that provide pigmented layers colored red (R), green (G) and blue (B) on a substrate with black matrix patterning are currently known (for example, refer to Patent documents 1 and 2). According to this method, a substrate stage on which a substrate is put is transferred to an exposure portion and located therein. In the exposure portion, exposure light is emitted from a light source portion to a predetermined area on the substrate through a mask smaller than the substrate, during a first exposure process. Subsequently, the substrate stage is moved a predetermined distance by a step motion. After the substrate is moved back into the exposure station (exposure portion), an area which is not exposed by the first exposure process is exposed in turn, during a second exposure process. Such exposure processes repeat so as to transfer the mask pattern to the entire surface of the large substrate.

Alternately, another conventional exposure method and exposure apparatus are disclosed in, for example, Patent documents 3 and 4. According to this method, a sheet type base material (substrate) which is reeled around a roll is brought to the exposure portion and located therein. In the exposure portion, the exposure light is emitted from the light source portion to the predetermined area on the base material through a mask with its size corresponding to the unit substrate. Thus, the mask pattern is transferred to the base material. Subsequently, the base material is brought out to be the same size as the unit substrate, and located again in the exposure portion. Such exposure process repeats so as to transfer the mask pattern to the base material in sequence, along the lengthwise direction thereof.

[Patent document 1] Japanese Unexamined Patent Application, First Publication, No. H09-127702
[Patent document 2] Japanese Unexamined Patent Application, First Publication, No. 2000-347020
[Patent document 3] Japanese Unexamined Patent. Application, First Publication, No. 2004-341280
[Patent document 3] Japanese Unexamined Patent Application, First Publication, No. 2001-264999

According to the conventional exposure methods and exposure apparatuses described above, however, after the exposure process for the predetermined area on the substrate (base material) is completed, the exposure process stops, the mask moves relative to the substrate (base material) by the step motion, the alignment process of the mask with the substrate (base material) is intermittently required again and again. In this manner, since the exposure process takes a long time, there exists a problem that disturbs efficiently carrying out the exposure process. Moreover, even if the size of the mask decreases to prevent its deformation due to weight thereof, the repetition frequency of the exposure process increases for the large substrate. Thereby, the exposure process takes more time so that the problem becomes further dominant.

In addition, even if a mask having a relative large size is employed in order to decrease the repetition frequency of the exposure process, a large amount of exposure energy is required. Accordingly, due to limited light source power, the exposure time should be longer. As a result, there exists a problem that disturbs the decrease in the exposure time.

Furthermore, since the mask position is adjusted to the substrate (base material) in the exposure portion, alignment marks, besides the mask pattern, should be preformed both on the mask and the substrate (base material). Accordingly, there exists a problem in that the fabrication process of the substrate (base material) and the mask becomes complicated.

DISCLOSURE OF INVENTION

The present invention was achieved in view of the above circumstances, and has as its object to provide an exposure method and an exposure apparatus that enable efficiently irradiation of a substrate having a wide exposure area by using a small mask.

An exposure method of the present invention, for continuously exposing an exposure area along a fixed direction, includes: transferring a substrate toward the fixed direction with a fixed velocity by a substrate transfer portion; detecting reference positions for the fixed direction and a perpendicular direction thereto through an image of a pattern edge of a reference pattern preformed on the substrate, wherein the image is taken by an image sensor portion at an image pick-up position; adjusting a position of a mask with the reference positions of the substrate when the substrate transfer portion moves the reference pattern from the image pick-up position to an exposure position; and transferring an image of an aperture of the mask to the substrate by exposure light that comes from a continuous light source and irradiates the exposure position passing through the mask provided at an optical axis of an exposure optical system.

An exposure apparatus of the present invention includes: a substrate transfer portion that transfers a substrate toward a fixed direction with a fixed velocity; an exposure optical system that emits exposure light from a continuous light source to the substrate through an aperture of a mask during transferring the substrate by the substrate transfer portion so as to transfer an image of the aperture to the substrate; an image sensor portion that takes an image of pattern edge of a reference pattern preformed on the substrate at an image pick-up position during transferring the substrate; and a control portion that detects reference positions for the fixed direction and a perpendicular direction thereto, based on the image of the pattern edge, so as to adjust a position of the mask with the reference positions of the substrate when the substrate transfer portion moves the reference pattern from an image pick-up position to an exposure position, wherein the control portion keeps the continuous light source to irradiate the substrate while an area from exposure starting edge to an exposure ending edge of the substrate passes the exposure position.

In the exposure apparatus of the present invention, the control portion may adjust the position of the mask along the perpendicular direction, based on the reference position of the perpendicular direction.

In the exposure apparatus, the control portion may adjust an azimuth of the mask, based on an offset azimuth to the fixed direction calculated from the reference positions.

In the exposure apparatus, the substrate transfer portion may bring a sheet type substrate from a storage roll and reel the sheet type substrate around a wind roll, so as to move the sheet type substrate along a perpendicular plane to an optical path in the exposure portion.

According to the exposure method and the exposure apparatus of the present invention, while the substrate transfer portion transfers the substrate, the exposure process can be continuously performed so as to transfer the mask aperture shape. In this manner, even when the small mask is employed, it is not necessary to intermittently repeat the exposure process by the step motion of the substrate. Thereby, the exposure process can be efficiently performed on the substrate having a wide exposure area.

Moreover, the reference position of the substrate is detected by using the preformed reference pattern on the substrate. The mask position can be adjusted, based on the reference position. In this manner, the exposure process for the predetermined area on the substrate can be precisely performed. Together with this, it is not necessary to form alignment marks on the mask and the substrate in order to adjust the mask position. Thereby, the fabrication thereof becomes easy.

In one embodiment, there is provided an exposure apparatus that adjusts the mask position along the perpendicular direction to the substrate transfer direction. With respect to this exposure apparatus, the mask position along the perpendicular direction to the substrate transfer direction can certainly be adjusted, based on the reference position along the perpendicular direction to the substrate transfer direction. In this manner, the exposure process for the exposure area can be precisely performed along the substrate transfer direction.

In one embodiment, there is provided an exposure apparatus that adjusts the mask azimuth to the substrate transfer direction. With respect to this exposure apparatus, the mask azimuth can certainly be adjusted, based on the offset azimuth to the substrate transfer direction. In this manner, the mask position is adjusted further precisely in response to a positional change of the substrate being transferred. Accordingly, the exposure process for the predetermined area can be performed further precisely.

In one embodiment, there is provided an exposure apparatus that brings the sheet type substrate from the storage roll and reels it around the wind roll. In this manner, the sheet type substrate moves along the perpendicular plane to the optical path in the exposure portion. With respect to this exposure apparatus, it is not necessary to intermittently repeat the exposure process for each exposure area corresponding to the unit substrate by the step motion of the substrate, where the plurality of exposure areas consecutively places on the sheet type substrate. Accordingly, the exposure process can be highly-efficiently performed on the plurality of substrates so as to enable enhanced productivity.

BRIEF DESCRIPTION OF THE DRAWINGS

FIG. 1 is a schematic diagram showing an exposure apparatus according to a first embodiment of the present invention.

Figure 2A:
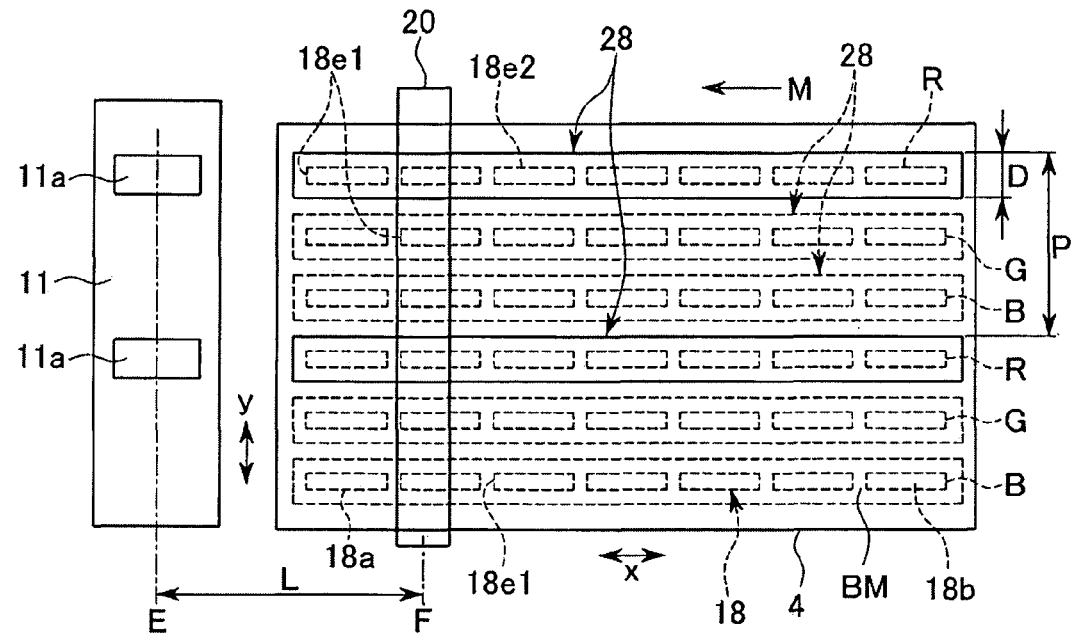
FIG. 2A is a plan-view that shows adjusting of a mask position of the exposure apparatus according to the first embodiment of the present invention.

REFERENCE SYMBOLS 1, 1A, 1B exposure apparatus
2 exposure station (exposure portion)
3, 3b exposure optical system
4, 4a substrate
5, 5a substrate transfer portion
6 image sensor portion
7 illumination
8 control portion
9 lamp (continuous light source)
10 illumination lens
10a projection lens
11 mask
11a aperture
12 mask stage
13 mask drive portion
16, 16a substrate drive portion
18 pixel (pattern)
18e1 front edge (pattern edge)
18e2 side edge (pattern edge)
20 linear CCD
21 image process portion
22 memory portion
23 operation portion
24 lamp power supply portion
25 substrate controller
26 mask stage controller
27 main control portion
E exposure position
F image pick-up position

BEST MODE FOR CARRYING OUT THE INVENTION

Figure 2B:
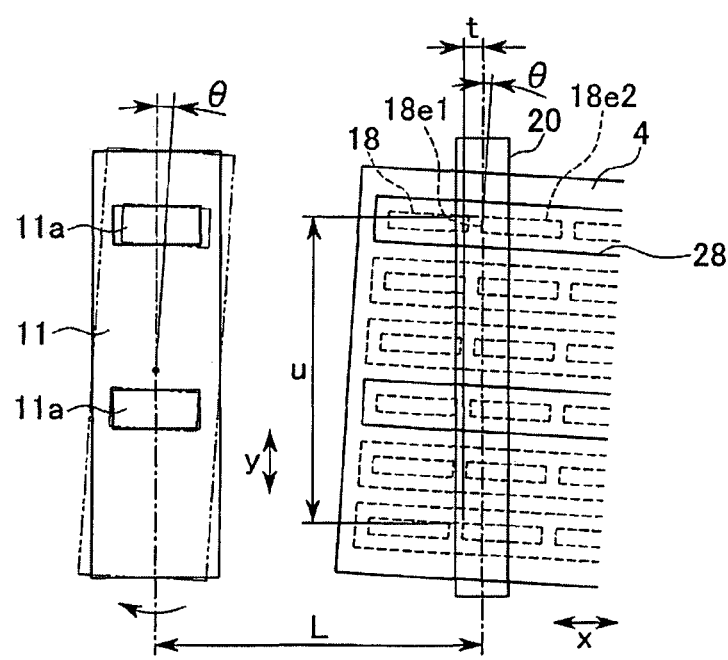
FIG. 2B is a plan-view that shows adjusting of a mask position of the exposure apparatus according to the first embodiment of the present invention.

An exposure apparatus according to a first embodiment of the present invention will be described hereinbelow with reference to FIG. 1, FIG. 2A and FIG. 2B.

FIG. 1 shows a schematic diagram of the exposure apparatus according to the first embodiment of the present invention. As shown in FIG. 1, the exposure apparatus 1 includes an exposure optical system 3 which is provided in an exposure station (exposure portion) 2, a substrate transfer portion 5 that transfers a substrate 4 of an exposed object below the exposure optical system 3, a image sensor portion 6 that takes an image of a specific part on the substrate 4, an illumination 7 that illuminates for recognizing the image of the substrate 4 from the under side thereof in the exposure station 2, and a control portion 8 that connects with and controls the above described portions. The exposure light is emitted from the exposure optical system 3 to the substrate 4 passing through an aperture of a mask 11 which is provided in the exposure optical system 3. A pattern tracing over a shape of the aperture is transferred to the substrate 4.

The exposure optical system 3 includes a lamp (continuous light source) 9 which is made of an ultra-high pressure mercury lamp or the like, an illumination lens 10 which is provided below the lamp 9 and projects the exposure light from the lamp 9 to the below side, the mask 11 which is provided below the illumination lens 10. An optical axis (optical path) S in the exposure optical system 3 is set along the vertical direction. The mask 11 is provided within the horizontal plane that is perpendicular to the optical axis S. The lamp 9 continues to emit the exposure light until the turn off being instructed, after the lamp 9 starts to irradiate. The mask 11 is made of a flat plate with a rectangular shape which has the lengthwise direction parallel to the Y-axis direction y. The Y-axis direction y is vertical in FIG. 1, or parallel to the vertical direction in FIG. 2A and FIG. 2B. The X-axis direction x is perpendicular to the Y-axis direction y, or parallel to the horizontal direction in FIG. 1 through FIG. 2B. The plurality of apertures 11a and 11a made of a rectangular shape with the lengthwise direction thereof along the X-axis direction x is provided at the center of the mask along the X-axis direction x, with a predetermined distance therebetween (2-piece of the apertures are shown in FIGS. 2A and 2B). The length of the apertures 11a along the X-axis direction x is set to be the same as that of a pixel 18 along the X-axis direction x in the substrate 4 (described later). The size of the mask 11 should be large enough to provide the apertures 11a and 11a. Accordingly, the breadthwise width of the mask 11 along the X-axis direction x is considerably shorter than the length of a unit substrate along the X-axis direction x, where the unit substrate is a substrate having its size corresponding to one liquid crystal panel or the like (refer to FIG. 2A and FIG. 2B).

The mask 11 is held on a mask stage 12 which is provided perpendicularly to the optical axis S in the exposure optical system 3. A virtual line that passes each center of the apertures 11a and 11a intersects the optical axis S in the exposure optical system 3. The mask stage 12 can adjust a position of the mask 11 along the Y-axis direction y and an azimuth of mask 11 around the vertical axis passing through the center thereof by a mask drive portion 13 that includes a servomotor, a linear motor and the like. The mask drive portion 13 includes (not shown) an encoder, and position and angle sensors made of a linear sensor or the like that detect a displacement along the Y-axis direction y and the azimuth of the mask stage 12 so as to feed the detected values back to the control portion 8.

The substrate transfer portion 5 includes a storage roll 14, a wind roll 15 and a substrate drive portion 16. The storage roll 14 is provided at one end of the exposure station 2 (right hand side in FIG. 1). The storage roll 14 reels and stores the film type (sheet type) substrate 4. The wind roll 15 is provided at the other end of the exposure station 2 (left hand side in FIG. 1). The wind roll 15 reels the substrate 4 which is brought from the storage roll 14. The substrate drive portion 16 is made of a servomotor or the like. The substrate drive portion 16 makes the wind roll 15 rotate, the substrate 4 is continuously transferred toward a traveling direction (fixed direction) M along the X-axis direction x, and hence, the wind roll 15 reels the substrate 4. The substrate drive portion 16 includes an encoder and a position sensor made of a linear sensor or the like that detects a displacement along the X-axis direction x so as to feed the detected value back to the control portion 8. The substrate transfer portion 5 further includes two pairs of guide rolls 17a and 17b that hold the substrate 4 with rolling at the upper and under surfaces thereof. The guide rolls 17a and 17b are provided at the both side of the exposure station 2 for the X-axis direction x. The substrate 4 moves and keeps the horizontal situation thereof below the mask stage 12 through the guide rolls 17a and 17b.

The substrate 4 is, for example, a color filter substrate. As shown in FIG. 2A, the substrate 4 includes a pixel (reference pattern) 18 which is made of the aperture having a rectangular shape and arranged like a matrix, in a black matrix BM. As set forth, the pixel 18 is aligned as a pixel array corresponding to respective pigmented layers (colored red R, green G and blue B) along the transfer direction of substrate 4, or the X-axis direction x. The pixel arrays are arranged perpendicularly to the transfer direction, or the widthwise direction of the substrate 4 (Y-axis direction y). The substrate 4 moves in the exposure station 2 while the surface f the substrate 4 keeps parallel to the horizontal plane being perpendicular to the optical axis S in the exposure optical system 3.

The reference pattern indicates a circuit pattern, an electrode pattern and the like in semiconductor devices, except the pattern shown in the present embodiment.

The image sensor portion 6 includes a half mirror 19 that faces to the illumination 7 and is provided between the illumination lens 10 and the mask 11. The image sensor portion 6 further includes a linear charge coupled device (CCD) 20 that takes an image reflected by the half mirror 19.

The linear CCD 20 is made of, for example, an array of photosensitive elements which are linearly aligned along the Y-axis direction y, and is longer than the width of the substrate 4 (along the Y-axis direction y). An optical axis S1 which is reflected by the half mirror 19 reaches a position (image pick-up position) F. The position F draws off a predetermined distance L against the traveling direction M of the substrate 4 from a position (exposure position) E. That is, the direction from the position E to the position F is toward the right hand side in FIG. 1 through FIG. 2B. Accordingly, a front edge (pattern edge) 18e1 of the pixel 18 on the substrate 4 (a front end of the pixel 18 toward the traveling direction M) is taken by the linear CCD 20 through the exposure light from the illumination 7, the predetermined time elapses, and hence, the pixel 18 reaches the exposure position E that corresponds to the center of the aperture 11a of the mask 11 along the X-axis direction x. Moreover, the linear CCD 20 takes an image of a side edge (pattern edge) 18e2 of the pixel 18 on the substrate 4. The side edge 18e2 is arranged at the Y-axis direction y side of the pixel 18.

The control portion 8 controls the total operation of the exposure apparatus 1. The control portion 8 includes a main control portion 27 that connects with an image process portion 21, a memory portion 22, an operation portion 23, a lamp power supply portion 24, a substrate controller 25 and a mask stage controller 26, and integrates and controls the operations thereof. The image process portion 21 detects a reference position of the substrate 4 for the X-axis direction x and the Y-axis direction y, based on an image data which is obtained through the image of the front edge 18e1 and the side edge 18e2 of the pixel 18 on the substrate 4, where the image is taken by the linear CCD 20. The memory portion 22 stores design data of the black matrix BM on the substrate 4, data of the reference position, a program for the total operation of the exposure apparatus 1, and the like. The operation portion 23 calculates a time in which the front edge 18e1 of the pixel 18 is transferred from the image pick-up position F to the exposure position E, based on the distance L between the image pick-up position F and the exposure position E, and on a transfer velocity of the substrate 4. Furthermore, the operation portion 23 calculates a misalignment along the Y-axis direction y, an offset azimuth θ and the like, where: the misalignment comes from the distance between the Y-axis direction y position of the mask 11 (aperture 11a) and the reference position of the substrate 4 for the Y-axis direction y (Y-axis reference position) based on the side edge 18e2 detected by the image process portion 21; and the offset azimuth θ comes from the azimuth of the substrate 4 to the transfer direction of substrate 4 (X-axis direction x) within the X-Y plane. The lamp power supply portion 24 keeps the lamp 9 to irradiate the exposure position E while a forefront pixel 18a leaves the exposure position E, and then, an endmost pixel 18b reaches the exposure position E, in response to the reference position of the substrate 4 for the X-axis direction x (X-axis reference position) due to the front edge 18e1. The substrate controller 25 drives the substrate drive portion 16 so as to transfer the substrate 4 toward the traveling direction M. The mask stage controller 26 drives the mask drive portion 13 so as to control the position for the Y-axis direction y and the azimuth within the X-Y plane of the mask stage 12.

Figure 3:
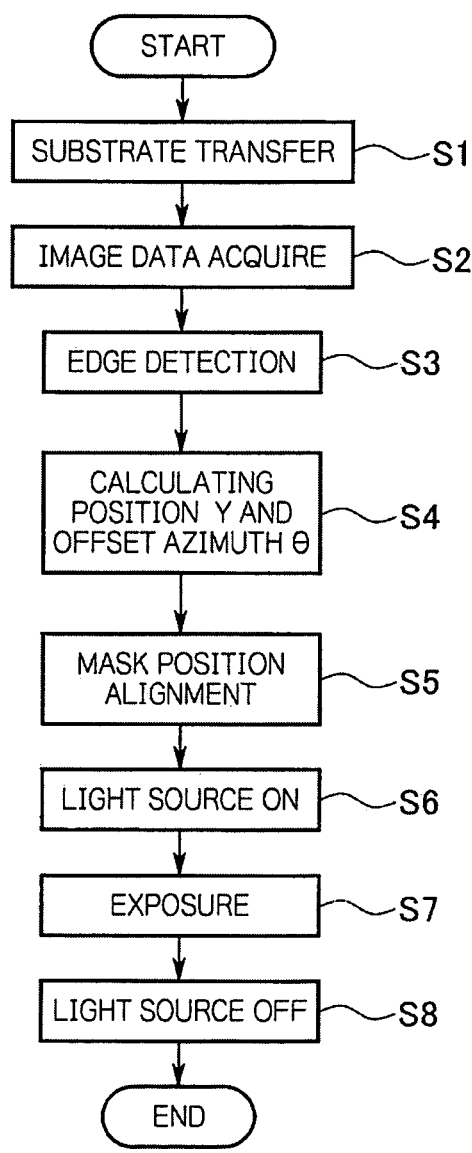
FIG. 3 is a flow chart showing an operation of the exposure apparatus according to the first embodiment of the present invention.

Subsequently, together with the operation of the exposure apparatus 1, which is constituted as described above, an exposure method according to the first embodiment of the present invention will be described hereinbelow with reference to FIG. 3. FIG. 3 shows a flow chart of the operation of the exposure apparatus 1.

Initially, the exposure apparatus 1 is turned on so as to be in an operational state of the control portion 8. Thereby, the illumination 7 receives the instruction from the main control portion 27, and hence, is turned on. Together with this, the substrate drive portion 16 in the substrate transfer portion 5 is driven through the substrate controller 25, the substrate 4 is brought from the storage roll 14, and hence, the substrate 4 is reeled around the wind roll 15. The substrate 4 is transferred toward the traveling direction M while keeping the horizontal situation thereof, in the exposure station 2 (step S1). During the step S1, the illumination 7 irradiates the substrate 4 from the under side, the illumination light passes through the pixel 18 formed on the substrate 4, and hence, the linear CCD 20 detects the illumination light reflected by the half mirror 19. Thereby, the image data of the pixel 18 is acquired (step S2).

The image data which is acquired by the linear CCD 20 is forwarded to the image process portion 21, and processed therein. The image process portion 21 detects the position of the front edge 18e1 (X-axis reference position) and the position of the side edge 18e2 (Y-axis reference position), where the front edge 18e1 of each pixel 18 aligns along the Y-axis direction y, and the side edge 18e2 of each pixel 18 aligns along the X-axis direction x (step S3). When the X-axis reference position and the Y-axis reference position of the forefront pixel 18a for the traveling direction M of the substrate 4 are detected, the operation portion 23 calculates an arrival time of the forefront pixel 18a to the exposure position E, based on the distance L between the exposure position E and the image pick-up position F, and the predetermined transfer velocity of the substrate 4. Together with this, the operation portion 23 calculates the misalignment between the position of the aperture 11a of the mask 11 and the Y-axis reference position along the Y-axis direction y, i.e., the misalignment of the substrate 4 along the Y-axis direction y (Y-axis misalignment). Furthermore, as shown in FIG. 2B, the operation portion 23 calculates the offset azimuth θ of the substrate 4 from the X-axis or Y-axis within the X-Y plane (offset azimuth to the transfer direction of substrate 4), based on a displacement t of the X-axis reference position and a distance u along the Y-axis direction of a pair of the pixels 18 which are separated from each other along the Y-axis direction y (step S4).

The main control portion 27 measures the arrival time of the forefront pixel 18a by a built-in timer when the X-axis reference position thereof is detected. After measuring the arrival time, the main control portion 27 drives the mask drive portion 13 to adjust the position of the mask stage 12 via the mask stage controller 26, in response to the Y-axis misalignment of the substrate 4 and the offset azimuth θ to the transfer direction of substrate 4 which are calculated through the operation portion 23. The mask drive portion 13 is driven, the position along the Y-axis direction y and the azimuth within the horizontal plane (around the optical axis S in the exposure optical system 3) of the mask stage 12 are adjusted, and hence, the position of the apertures 11a and 11a of the mask 11 correctly adjusts to exposure areas 28 and 28 on the substrate 4 (step S5). Simultaneously, the main control portion 27 instructs the lamp power supply portion 24 to turn on the lamp 9. The exposure light from the lamp 9 is collimated through the illumination lens 10 so as to irradiate the substrate 4 passing through the apertures 11a and 11a of the mask 11. Thereby, the shape of the apertures 11a and 11a is transferred to the predetermined position on the substrate 4 through this exposure process (step S6).

During the exposure process, the substrate 4 is continuously transferred toward the traveling direction M with a fixed velocity, and the linear CCD 20 always takes the image of the forefront pixel 18a and the endmost pixel 18b for each pixel 18a. In this manner, the X-axis reference position and the Y-axis reference position of the substrate 4 are detected. Therefore, the position along the Y-axis y and the azimuth of the mask 11 are adjusted, in response to the Y-axis misalignment of the substrate 4 and the offset azimuth θ thereof to the transfer direction of substrate 4. Accordingly, the position of the apertures 11a and 11a of the mask 11 is adjusted so that the predetermined exposure areas 28 and 28 on the substrate 4 can be correctly exposed (step S7).

When the exposure process is advanced and the X-axis reference position of the endmost pixel 18b for the traveling direction M of the substrate 4 is detected, the main control portion 27 instructs the lamp power supply portion 24 to turn off the lamp 9 after the arrival time of the X-axis reference position to the exposure position E. Thereby, the exposure process to the substrate 4 is completed (step S8).

As is mentioned above, the exposure process is completed for an area corresponding to one unit substrate on the sheet type (film type) base material (substrate) 4. Subsequently, while the base material 4 is transferred toward the traveling direction M, the same exposure process is performed on a neighboring exposure area. It is possible to continuously perform an exposure (proxy exposure) for an area made of a plurality of unit substrates along the lengthwise direction of the base material 4 by repeating the above exposure process.

The predetermined exposure areas 28 and 28 have a width D that matches the breadthwise width of the apertures 11a and 11a of the mask 11. The exposure areas 28 and 28 are made of a plurality of band arrays which are arranged to have an interval P along the Y-axis direction y of the substrate 4 (2 band arrays are shown by the solid line in FIGS. 2A and 2B, as an example). The exposure areas 28 and 28 are made of band type areas that surround the pixel 18 aligned along the X-axis direction x, where the surrounded pixel 18 corresponds to the red (R) pigment layer in the color filter.

Alternately, for the other pigmented layers colored Green (G) and Blue (B) in the black matrix BM on the substrate 4, the exposure process is performed by other exposure stations which are individually provided and the same as above. Furthermore, since the black matrix BM on the substrate 4 is coated with a color pigment prior to the exposure process, the exposure light stiffens the color pigment of an exposed part. Then, when the exposed substrate 4 is washed with a cleaning solvent, the color pigment of an unexposed part is removed so as to form the pixel 18 made of each colored pigmented layer (R, G and B) in the exposure areas 28 and 28 by the stiffened color pigments.

As described above, the exposure method according to the first embodiment emits the exposure light of continuous light from the lamp 9 to the substrate 4 in the exposure station 2, where: the exposure light passes through the apertures 11a and 11a on the mask 11 provided at the optical axis S in the exposure optical system 3 so as to transfer the image of the apertures 11a and 11a to the substrate 4; and the substrate 4 is transferred toward the fixed direction with the fixed velocity due to the substrate transfer portion 5. In this manner, the image sensor portion 6 takes the image of the front edge 18e1 and the side edge 18e2 of the pixel 18 preformed on the substrate 4 so as to detect the X-axis reference position along the transfer direction (X-axis direction x) and the Y-axis reference position along the Y-axis direction y, respectively. When the pixel 18 whose image is taken by the image sensor portion 6 is transferred to the exposure station 2, the position of the mask 11 adjusts to the reference positions of the substrate 4 so that the exposure process is continuously performed on the exposure areas 28 and 28 along the transfer direction of the substrate 4.

Alternately, the exposure apparatus 1 according to the first embodiment includes: the substrate transfer portion 5 that transfers the substrate 4 toward the fixed direction with the fixed velocity, since the substrate drive portion 16 makes the wind roll 15 reel the substrate 4 stored in the storage roll 14; and the exposure optical system 3 that transfers the image of the apertures 11a and 11a to the substrate 4, since the exposure light of continuous light from the lamp 9 passes through the apertures 11a and 11a on the mask 11 so as to irradiate the substrate 4 being transferred by the substrate transfer portion 5. The exposure apparatus 1 includes the image sensor portion 6 that takes the image of the front edge 18e1 and the side edge 18e2 of the pixel 18 preformed on the substrate 4 during the substrate 4 being transferred. The exposure apparatus 1 includes the control portion 8 that detects the reference positions of the substrate 4 for the transfer direction (X-axis direction x) and its perpendicular direction of the Y-axis direction y, respectively, based on the image of the front edge 18e1 and the side edge 18e2 taken by the image sensor portion 6. The control portion 8 adjusts the position of the mask 11 with the reference positions of the substrate 4, when the pixel 18 whose image is taken by the image sensor portion 6 is transferred from the image pick-up position F to the exposure position E. The control portion 8 keeps the lamp 9 to irradiate the substrate 4 via the lamp power supply portion 24 while an exposure starting edge to an exposure ending edge of the substrate 4 passes the exposure position E.

For this reason, according to the exposure method and the exposure apparatus 1 of the first embodiment, it is possible to perform the exposure process continuously and transfer the shape of the apertures 11a and 11a on the mask 11, while the substrate 4 is transferred by the substrate transfer portion 5. In this manner, even when the small mask is employed, it is not necessary to intermittently repeat the exposure process by the step motion of the substrate 4. Thereby, the exposure process can be efficiently performed on the substrate 4 having a wide exposure area.

Moreover, the position of the mask 11 can be adjusted, based on the reference positions of the substrate 4, where the reference positions are detected by using the preformed pixel 18 (reference pattern) on the substrate 4. Thereby, the exposure process for the predetermined exposure areas 28 and 28 on the substrate 4 can be precisely performed. Together with this, it is not necessary to form the alignment marks on the mask 11 and the substrate 4 for adjusting the position of the mask. 11, and their fabrication becomes easy.

Alternately, according to the exposure apparatus 1, it is not necessary to intermittently repeat the exposure process for each exposure areas 28 and 28 corresponding to the unit substrate by the step motion of the sheet type substrate 4, where the plurality of exposure areas 28 consecutively places on the sheet type substrate 4. Accordingly, the exposure process can be highly-efficiently performed on a plurality of substrates so as to enable enhanced productivity.

As for the exposure apparatus 1, the control portion 8 adjusts the position of the mask 11 along the Y-axis direction y being perpendicular to the transfer direction of the substrate 4, based on the reference positions of the substrate 4 for the transfer direction (X-axis direction x) and its perpendicular direction of the Y-axis direction y, respectively. Together with this, the control portion 8 adjusts the azimuth of the mask 11, based on the offset azimuth θ to the transfer direction of substrate 4 by detecting the reference positions. In this manner, the position along the Y-axis direction y and the azimuth of the mask 11 can be simultaneously and certainly adjusted, in response to the Y-axis reference position being perpendicular to the transfer direction of the substrate 4 and the offset azimuth θ to the transfer direction of the substrate 4. Thereby, the position of the mask 11 is adjusted more precisely so that the predetermined exposure areas 28 and 28 can be exposed more precisely, in response to the positional change of the substrate 4 being transferred.

Figure 4:
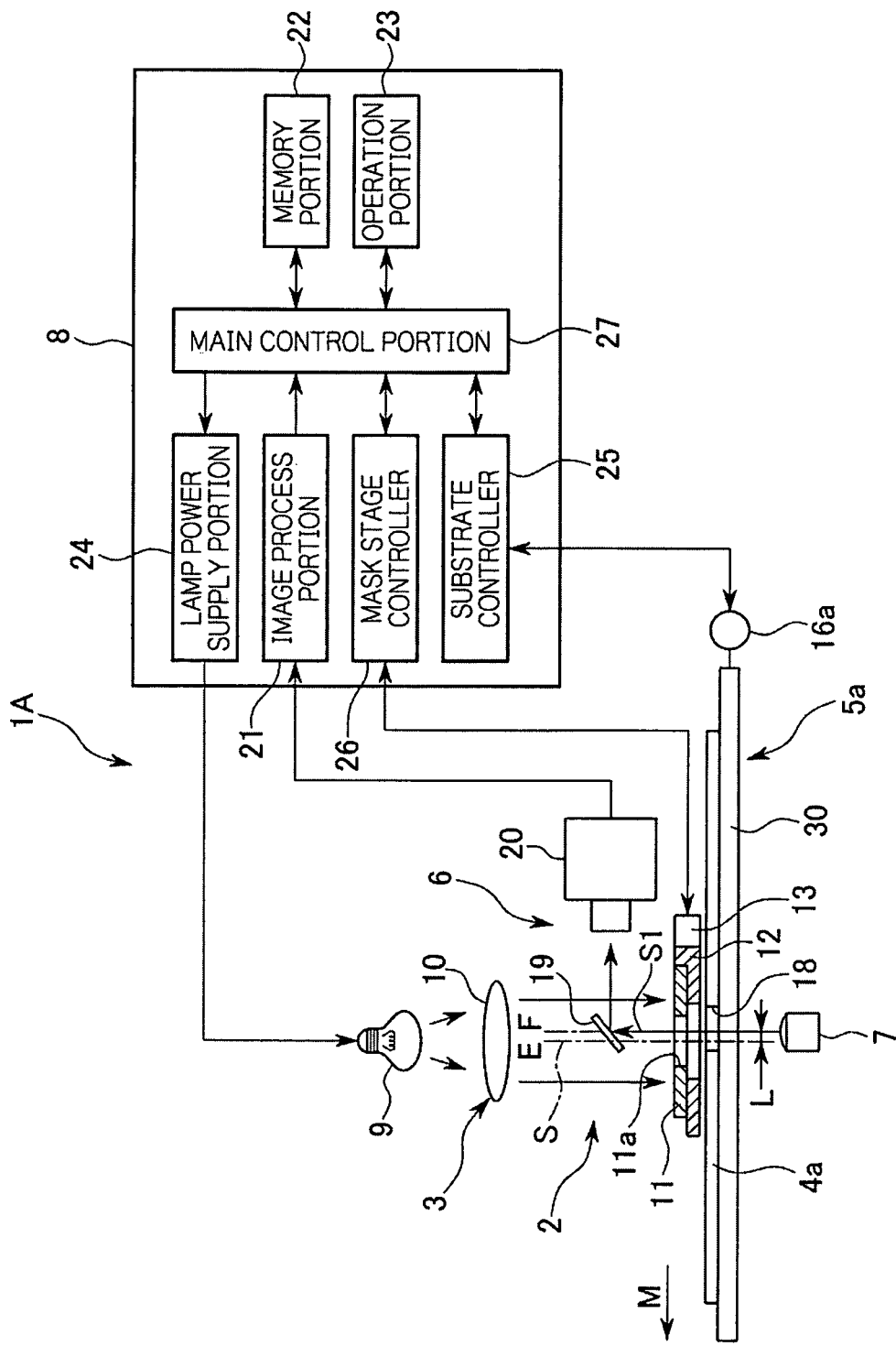
FIG. 4 is a schematic diagram showing an exposure apparatus according to a second embodiment of the present invention.

Subsequently, an exposure apparatus 1A according to a second embodiment of the present invention will be described hereinbelow with reference to FIG. 4. FIG. 4 shows a schematic diagram of the exposure apparatus 1A. The exposure apparatus 1A includes a plate type unit substrate (substrate) 4a that puts on a substrate stage 30. The substrate 4a is transferred toward the travelling direction M along the X-axis direction x in the exposure station 2. Since other constitution is the same as that of the exposure apparatus 1 according to the first embodiment, a same code is provided to a similar constitution element and the explanation thereof is omitted.

As for the exposure apparatus 1A, the substrate stage 30 is provided below the mask stage 12 and along the perpendicular plane to the optical axis S in the exposure optical system 3. A substrate transfer portion 5a includes a substrate drive portion 16a which is made of a servomotor, a linear motor and the like. The substrate transfer portion 16a is driven by the instruction from the substrate controller 25 so that the substrate stage 30 moves backward and forward along the X-axis direction x. The substrate drive portion 16a includes, not shown, an encoder, and a position sensor made of a linear sensor or the like that detect a displacement along the X-axis direction x of the substrate 4a so as to feed the detected value back to the control portion 8. The substrate stage 30 is constructed of a frame type structure not to shade from the illumination light from the illumination 7 below the substrate stage 30. The substrate stage 30 supports the substrate 4a through the surrounding part thereof.

As for the exposure apparatus 1A, the substrate transfer portion 16a is driven by the instruction from the substrate controller 25 so that the substrate stage 30 is transferred toward the traveling direction M. While the substrate 4a on the substrate stage 30 is transferred toward the travelling direction M in the exposure station 2, the exposure optical system 3 continuously exposes the predetermined exposure areas 28 and 28 from the front end part (exposure starting edge) for the travelling direction M, and the exposure process stops at the back end (exposure ending edge) for the travelling direction M. After the exposure process for one substrate 4a is completed, the substrate stage 30 goes back again, the next substrate 4a puts on the substrate stage 30, and then, the next exposure process starts. These operations repeat so as to perform the exposure process. During the exposure process, the position of the mask 11 is adjusted, in response to the positional change of the substrate 4a along the Y-axis direction y and the offset azimuth θ to the transfer direction of the substrate 4a, that is similar to the exposure apparatus 1 of the first embodiment.

According to the exposure apparatus 1A of the second embodiment, while the substrate 4a is transferred toward the traveling direction M, likewise to the exposure apparatus 1 of the first embodiment, the exposure process can be continuously performed. Thereby, it is possible to efficiently perform an exposure (proxy exposure) for the predetermined exposure areas 28 and 28. Together with this, the exposure method of the first embodiment can certainly be performed.

Figure 5:
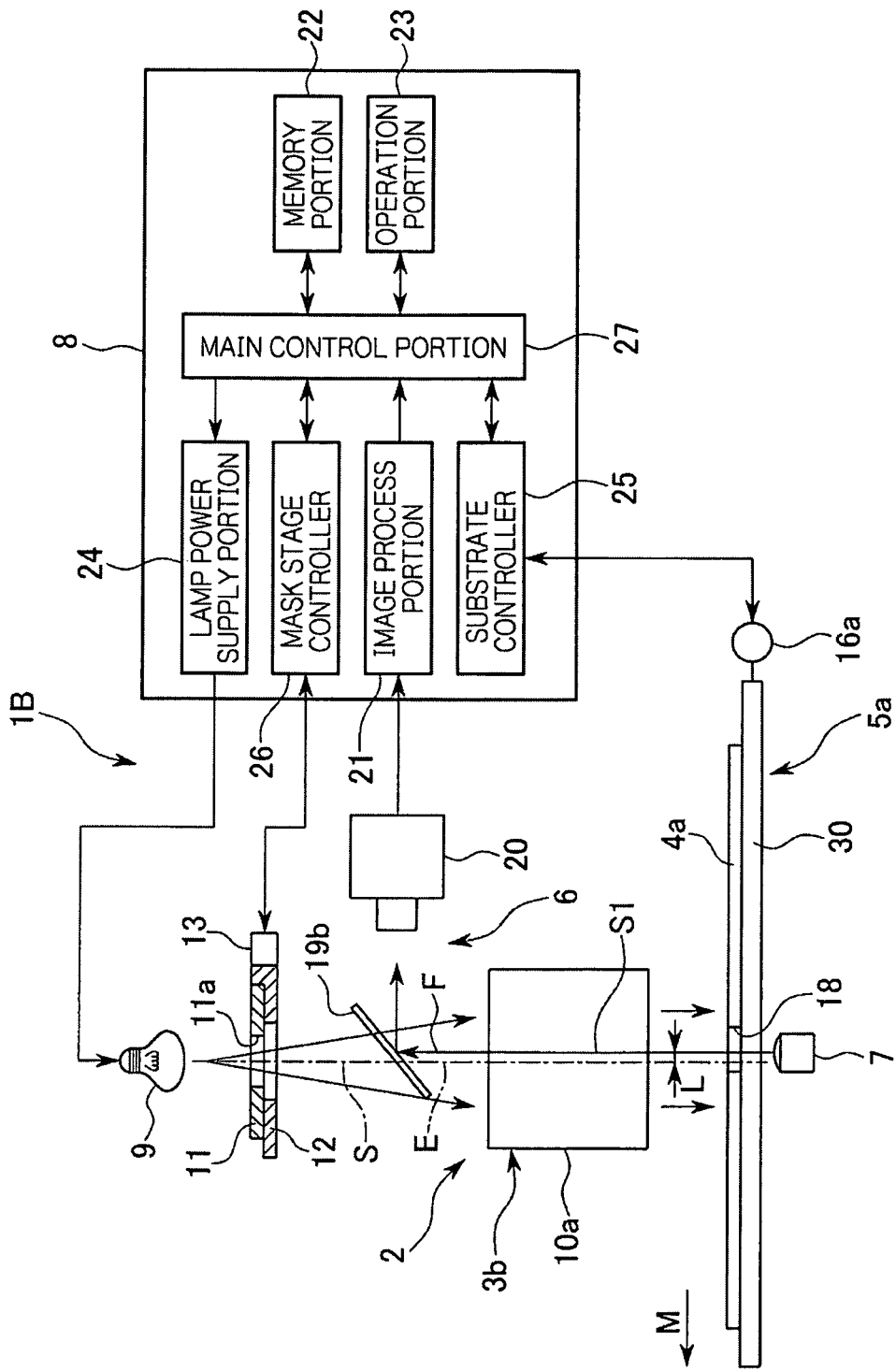
FIG. 5 is a schematic diagram showing an exposure apparatus according to a third embodiment of the present invention.

Subsequently, an exposure apparatus 1B according to a third embodiment of the present invention will be described hereinbelow with reference to FIG. 5. FIG. 5 shows a schematic diagram of the exposure apparatus 1B. An exposure optical system 3b of the exposure apparatus 1B includes a projection lens 10a instead of the illumination lens 10 in the exposure optical system 3 of the exposure apparatus 1A of the second embodiment. The projection lens 10a is provided near and above the substrate stage 30 (substrate 4a). The mask stage 12 is provided between the projection lens 10a and the lamp 9. A half mirror 19b is provided between the projection lens 10a and the mask stage 12. Since other constitution is the same as that of the exposure apparatus 1A according to the second embodiment, the same code is provided to a similar constitution element and the explanation thereof is omitted.

As for the exposure apparatus 1B, during the exposure process, the exposure light of continuous light from the lamp 9 passes through the aperture 11a on the mask 11, and irradiates the substrate 4b through the projection lens 10a. Thereby, the shape of the aperture 11a is transferred to the substrate 4a. Thus, likewise to the exposure apparatus 1A of the second embodiment, when the substrate 4a on the substrate stage 30 is transferred toward the travelling direction M in the exposure station 2, the exposure optical system 3b continuously performs the exposure process (projection exposure) for the predetermined exposure areas 28 and 28. During this exposure process, the position of the mask 11 is adjusted, in response to the positional change of the substrate 4a along the Y-axis direction y and the offset azimuth θ to the transfer direction of the substrate 4a, that is similar to the exposure apparatus 1 of the first embodiment The position adjusting can be made by moving the projection lens 10a that attaches a drive portion similar to the mask drive portion 13, instead of moving the mask stage 12.

According to the exposure apparatus 1B of the third embodiment, while the substrate 4a is transferred toward the traveling direction M, the exposure process can be continuously performed, likewise to the exposure apparatuses 1 and 1A of the first and second embodiments. Thereby, it is possible to efficiently perform the exposure process for the predetermined exposure areas 28 and 28. Together with this, the exposure method according to the first embodiment can certainly be performed.

According to the exposure apparatuses 1, 1A and 1B of the above-mentioned embodiments, the main control portion 27 instructs the lamp power supply portion 24 to turn the lamp 9 on when the exposure starting edge of the substrate 4a reaches the exposure position E. The main control portion 27 instructs the lamp power supply portion 24 to turn the lamp 9 off when the exposure ending edge of the substrate 4a reaches the exposure position E. In this manner, the exposure process is completed. In place of that, a shutter is provided below the lamp 9, the shutter opens and closes while the lamp 9 keeps turning on, and hence, it may start the exposure process at the exposure starting edge and complete the exposure process at the exposure ending edge. Alternately, according to the exposure apparatuses 1, 1A and 1B of the above-mentioned embodiments, there indicates examples in which the pigmented layers (R, G and B) are formed on the substrate with black matrix patterning when the color filter is manufactured. However, the present invention is not limited by the above examples, but can be applied to the cases of manufacturing a transparent thin film electrode for the liquid crystal panel, and other semiconductor device, a mask, a reticle or the like.

INDUSTRIAL APPLICABILITY

The exposure method and the exposure apparatus of the present invention can be employed for manufacturing the color filter for the liquid crystal panel, the transparent thin film electrode and the semiconductor device. The exposure method and the exposure apparatus can continuously perform the exposure process in which the mask aperture shape is transferred while the substrate transfer portion transfers the substrate. Therefore, even when the small mask is employed, it is not necessary to intermittently repeat the exposure process by the step motion of the substrate. Accordingly, the exposure process can be efficiently performed on the substrate having a wide exposure area.

The invention claimed is:

1. An exposure method for continuously exposing an exposure area along a fixed direction, comprising:
    transferring a substrate toward said fixed direction with a fixed velocity by a substrate transfer portion, the substrate being preformed with a plurality of rectangular pixels arranged in a matrix, each of the rectangular pixels having a side edge parallel to the fixed direction and a front edge parallel to a perpendicular direction perpendicular to the fixed direction;
    detecting reference positions of the substrate for said fixed direction and said perpendicular direction through an image of the side edge and the front edge, respectively, of each of the rectangular pixels, which is regarded as a reference pattern, wherein said image is taken by an image sensor portion at an image pick-up position;
    adjusting a position of a mask with said reference positions of said substrate when said substrate transfer portion moves said reference pattern from said image pick-up position to an exposure position; and
    transferring an image of an aperture of said mask to form a band-shaped exposure area surrounding the rectangular pixels aligned along the fixed direction on said substrate by exposure light that comes from a continuous light source and irradiates said exposure position passing through said mask provided at an optical axis of an exposure optical system.

2. An exposure apparatus comprising:
    a substrate transfer portion that transfers a substrate toward a fixed direction with a fixed velocity, the substrate being preformed with a plurality of rectangular pixels arranged in a matrix, each of the rectangular pixels having a side edge parallel to the fixed direction and a front edge parallel to a perpendicular direction perpendicular to the fixed direction;
    an exposure optical system that emits exposure light from a continuous light source to said substrate through an aperture of a mask during transferring said substrate by said substrate transfer portion so as to transfer an image of said aperture to said substrate;
    an image sensor portion that takes an image of the rectangular pixels which is regarded as a reference pattern at an image pick-up position during transferring said substrate; and
    a control portion that detects reference positions for said fixed direction and said perpendicular direction, based on said image of the side edge and the front edge, respectively, of each of the rectangular pixels so as to adjust a position of said mask with said reference positions of said substrate when said substrate transfer portion moves said reference pattern from said image pick-up position to an exposure position, wherein said control portion keeps said continuous light source to irradiate said substrate while an area from an exposure starting edge to an exposure ending edge of said substrate passes said exposure position so as to form a band-shaped exposure area surrounding the rectangular pixels aligned along the fixed direction on said substrate.

3. The exposure apparatus as recited in claim 2, wherein said control portion adjusts said position of said mask along said perpendicular direction, based on said reference position of said perpendicular direction.

4. The exposure apparatus as recited in claim 2, wherein said control portion adjusts an azimuth of said mask, based on an offset azimuth to said fixed direction calculated from said reference positions.

5. The exposure apparatus as recited in claim 2, wherein said substrate transfer portion brings a sheet type substrate from a storage roll and reels said sheet type substrate around a wind roll, so as to move said sheet type substrate along a perpendicular plane to an optical path in said exposure portion.

* * * * *